United States Patent [19]
Latz

[11] Patent Number: 5,417,834
[45] Date of Patent: May 23, 1995

[54] ARRANGEMENT FOR GENERATING A PLASMA BY MEANS OF CATHODE SPUTTERING

[75] Inventor: Rudolf Latz, Rodgau-Dudenhofen, Germany

[73] Assignee: Leybold Aktiengesellschaft, Hanau, Germany

[21] Appl. No.: 126,972

[22] Filed: Sep. 24, 1993

[30] Foreign Application Priority Data

Oct. 17, 1992 [DE] Germany ............... 42 35 064.6

[51] Int. Cl.⁶ .................................. C23C 14/44
[52] U.S. Cl. ..................... 204/298.11; 204/192.12; 204/298.08; 204/298.09; 204/298.19
[58] Field of Search ............. 204/298.06, 298.08, 204/298.11, 298.16, 298.17, 298.19, 298.34, 298.37, 192.12

[56] References Cited

U.S. PATENT DOCUMENTS

| | | | |
|---|---|---|---|
| 4,990,229 | 2/1991 | Campbell et al. | 204/298.06 |
| 5,126,032 | 6/1992 | Szczyrbowski et al. | 204/298.08 |
| 5,277,778 | 1/1994 | Daube et al. | 204/298.18 |
| 5,279,669 | 1/1994 | Lee | 204/298.16 |

FOREIGN PATENT DOCUMENTS

| | | |
|---|---|---|
| 0254168 | 1/1988 | European Pat. Off. . |
| 0271341 | 6/1988 | European Pat. Off. . |
| 0403418 | 12/1990 | European Pat. Off. . |
| 4042298 | 7/1992 | Germany . |
| 8606923 | 11/1986 | WIPO . |
| 9207969 | 5/1992 | WIPO . |

OTHER PUBLICATIONS

Matsuo Yamashita: "Effect of magnetic field on plasma characteristics of built-in high-frequency coil type sputtering apparatus", J. Vac. Sci. Technol. A 7 (4), Jul./Aug. 1989, pp. 2752-2757.

*Primary Examiner*—R. Bruce Breneman
*Assistant Examiner*—Rodney G. McDonald
*Attorney, Agent, or Firm*—Felfe & Lynch

[57] ABSTRACT

The invention relates to an arrangement for generating a plasma by means of cathode sputtering. This arrangement comprises a magnetron and a target with shielding metal sheets. About these shielding metal sheets are wound two coils with a common center axis of which the one coil is connected to a dc power source and the other coil to a high-frequency source. Through the cooperation of the fields of both coils result helicon or whistler waves.

12 Claims, 3 Drawing Sheets

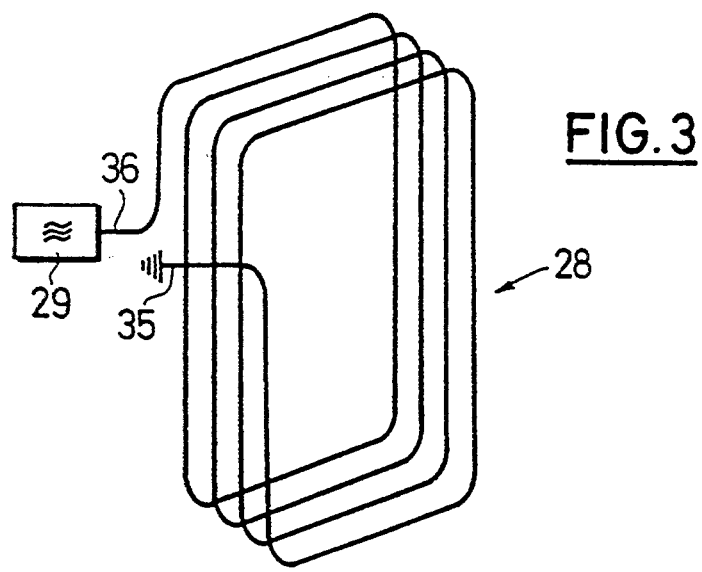
FIG.3
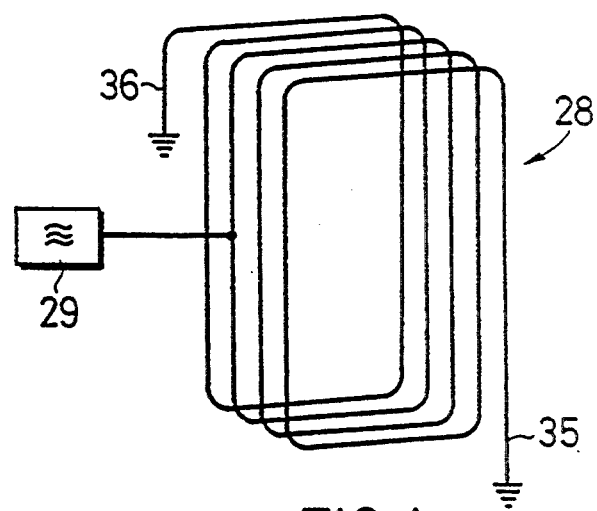
FIG.4
FIG.5
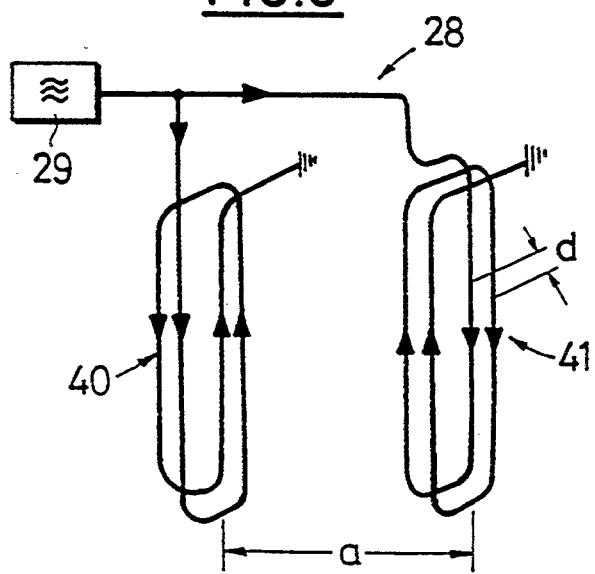

ARRANGEMENT FOR GENERATING A PLASMA BY MEANS OF CATHODE SPUTTERING

BACKGROUND OF THE INVENTION

The invention relates to an arrangement for generating a plasma by means of cathode sputtering according to the preamble of patent claim 1.

In numerous fields of technology it is required to apply thin layers on substrates. For example, glass panes are coated in order to lend to them special properties or watch cases comprising a less noble material are coated with a layer comprising a noble material.

For the application of thin layers on substrate numerous processes have already been suggested of which only the electroplating technique and the coating out of a plasma will be mentioned. The coating out of the plasma has increasingly gained in importance during the past years because it permits a multiplicity of materials as coating material.

In order to generate a plasma suitable for coating, also various processes have been suggested. Of these processes the cathode sputtering process is of great interest due to its high coating rates.

In a known arrangement for the generation of a plasma of high density a high-frequency generator is used which transmits 13.56 MHz waves along a magnetic field which arrives through an external magnetic field generator into the discharge volume (U.S. Pat. No. 4,990,229). With the aid of this arrangement helicon whistler waves are excited in a plasma volume which lead to a particularly high plasma activation. In order to excite particular wave modes for whistler waves, special antenna structures are provided. An antenna for the excitation of whistler waves at an excitation frequency of 13.56 MHz is layed out so that it excites the m=0 and m=1 modes.

The disadvantage of the known arrangement resides therein that with it indeed a highly activated and high ionized plasma can be generated, however, that it is not possible to carry out a sputter coating.

Furthermore, a sputter installation is known which comprises a high-frequency excitation coil with four windings, which is disposed between a disk-form target and a substrate holder in a conventional DC diode installation (Matsuo Yamashita: "Effect of magnetic field on plasma characteristics of built-in high-frequency coil type sputtering apparatus", J. Vac. Sci. Technol. A 7 (4), July/August 1989, p. 2752-2757). Perpendicularly to the axis of the high-frequency excitation coil extends in addition a static magnetic field which penetrates into the plasma region. With this sputter installation it is however not possible to generate whistler waves.

SUMMARY OF THE INVENTION

The invention is based on the task of acting upon the plasma volume of a magnetron cathode with an HF wave in such a way that whistler waves can be formed.

This task is solved according to the features of patent claim 1.

The advantage achieved with the invention resides in particular therein that due to a higher volume effectiveness a significantly higher degree of ionization can be achieved than in conventional arrangements. Through the excitation of whistler waves in the plasma the plasma is particularly effectively ionized. But even without excitation of "whistler waves", i.e. with normal excitation, a higher plasma ionization degree is generated than in installations in which no wave coupling takes place. Through the invention the high plasma density and the sputter coating are combined.

BRIEF DESCRIPTION OF THE DRAWINGS

An embodiment example of the invention is depicted in the drawing and will be described in the following in greater detail. Therein show.

DESCRIPTION OF A PREFERRED EMBODIMENT

Figure 1:
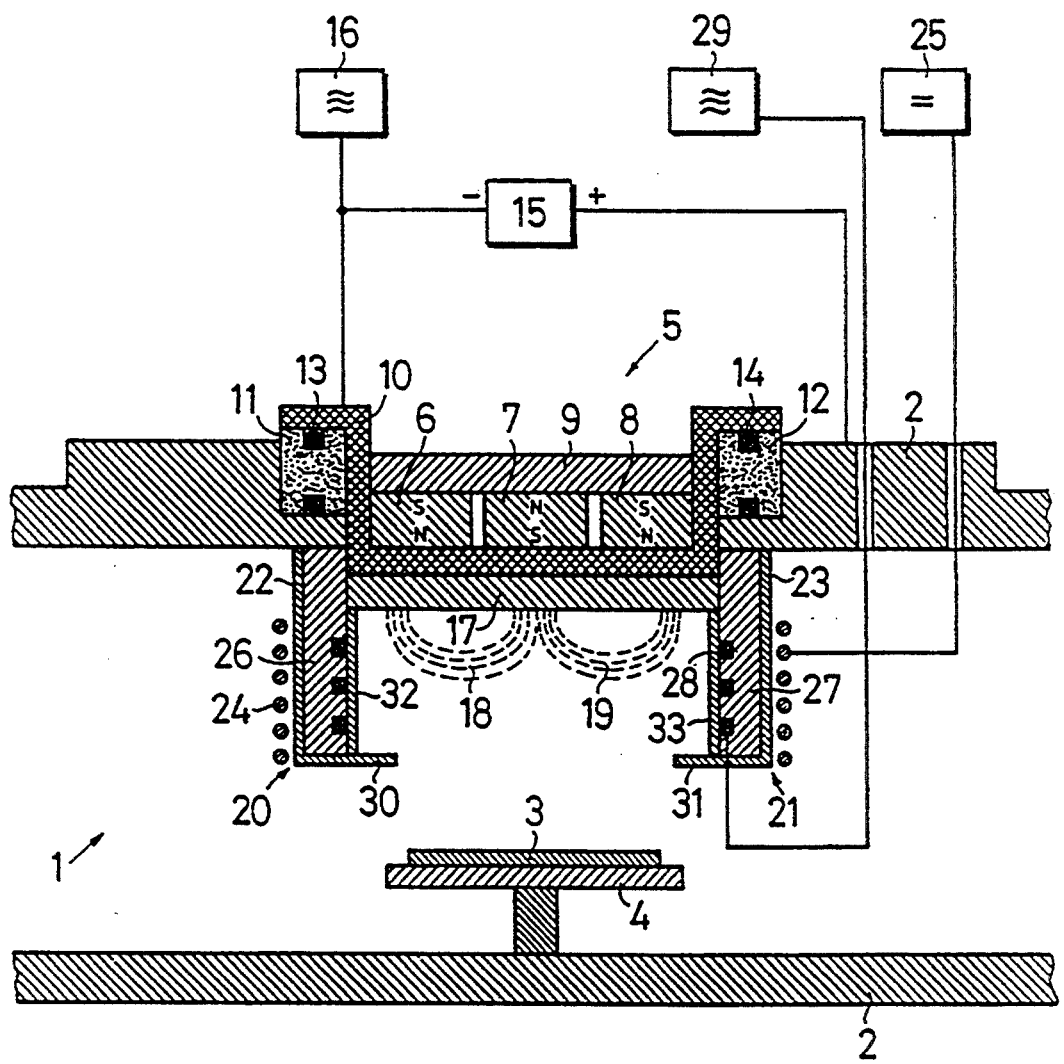
FIG. 1 a plasma chamber with a magnetron cathode and a coil antenna.

In FIG. 1 is depicted a segment from a plasma chamber 1 which is encompassed by a housing 2. In the lower region of the housing 2 is disposed a substrate 3 on a rotary table 4. Above the substrate 3 which is to be etched or coated, is provided a magnetron cathode 5, which, in turn, comprises three permanent magnets 6, 7, 8, a yoke 9 as well as a cathode tub 10. The cathode tub 10 rests on insulators 11, 12 provided with sealings 13, 14. These insulaltors 11, 12 are embedded in the upper side of the housing 2. At the electrode tub 10 is connected the negative pole of a dc power supply 15 whose positive pole is connected with the housing chassis of the receptacle 2. Alternatively to the dc power supply 15 can also be provided a high-frequency supply 16. Below the cathode tub 10 is disposed a target 17, through which penetrate the magnetic field lines 18, 19 of the permanent magnets 6 to 8. At both sides of the target 17 is disposed an L-form shielding 20, 21.

Around the vertical portion 22, 23 of the shielding 20, 21 is wound a coil 24, which is connected at a dc voltage source 25. The coil 24 is a coil for the generation of an additional magnetic field in the plasma volume. It is preferably operated with dc current and preferably is a hollow tube so that a cooling means can flow through it. Facing the vertical portion 22, 23 is provided an insulator 26, 27 comprising grooves in which a further coil 28 is disposed which is connected to a high-frequency source 29. The insulator 26, 27 is closed off on its under side by a horizontal portion 30, 31 behind the shielding 20, 21. This portion of the shielding 20, 21 is electrically insulated and can either be grounded or connected to any desired electrical potential. It represents the effective anode of the arrangement and can be utilized simultaneously as a distribution diaphragm. Facing the coil 28 functioning as antenna is disposed a cover plate 32, 33 comprising an insulating material, for example glass or metal. In the case of a metal cover plate the latter is disposed so as to be insulated and can either be electrically floating or be impressed from the outside with any desired voltage. The high-frequency source 29 by means of the antenna coil 28 generates in the plasma volume electromagnetic waves which can develop into whistler waves. Through the cooperation of the electromagnetic waves of coil 28 with the field of coil 24 results an excitation of helicon modes in the plasma.

Figure 2:
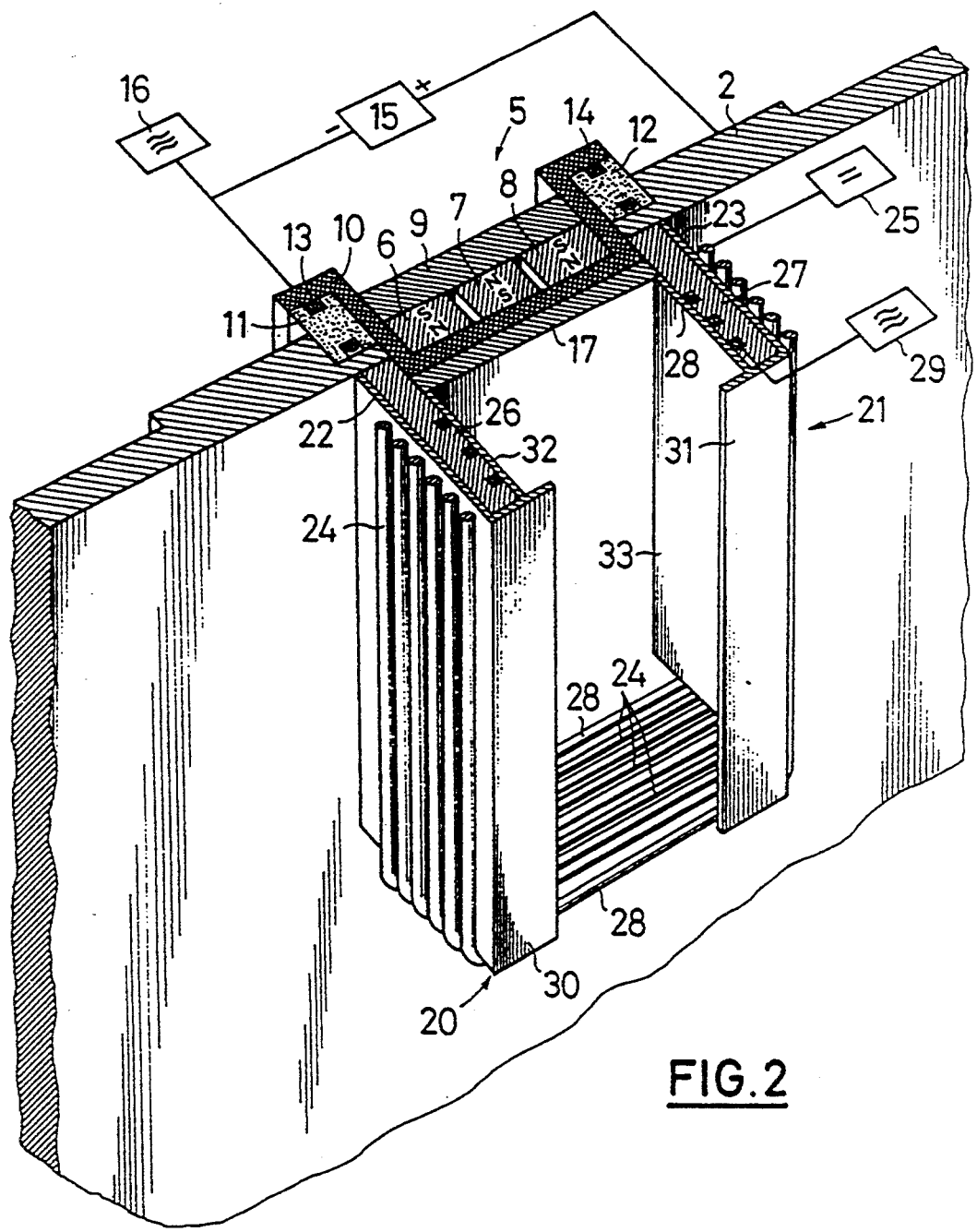
FIG. 2 a perspective view of the magnetron cathode and the coil antenna according to FIG. 1, FIG. 3 a first high-frequency coil arrangement, FIG. 4 a second high-frequency coil arrangement, FIG. 5 a third high-frequency coil arrangement.

FIG. 2 depicts the magnetron cathode 5 with the shielding 20, 21 and the two coils 24 and 28. It can herein be clearly seen that the coils 24, 28 are embedded in the shielding 20, 21 or envelopes it in such a way that the magnetic fields generated with current throughflow are oriented perpendicularly on the target 17. The substrate 3 and the rotary plate 4 are omitted in FIG. 2. The supply sources 25 and 29 are depicted within the housing 2 although in actuality they are disposed outside of this housing 2, as shown in FIG. 1.

A more detailed representation of the high-frequency coil 28 is depicted in FIGS. 3 to 5. In FIG. 3 the coil 28 is wound in the clockwise direction and connected with its one end to chassis or ground, while its other end 36 is connected to the frequency source 29.

In the coil configuration according to FIG. 4 both ends 35, 36 of coil 28 are connected to ground or chassis, while the high-frequency source 29 is connected to the center of coil 28.

In FIG. 5 the coil 28 is divided into two halves 40, 41 wherein the direction of winding of these two halves 40, 41 is opposite. Both halves are embedded at a given distance one from the other in the grooves of an insulator. The core of these halves 40 is embedded in insulator portion 26 while the other half 41 is disposed in the grooves of insulator portion 27. The direction of winding of the coil halves 40, 41 is therein such that their magnetic fields extend parallel to the surface of target 17. By d is denoted the groove width while by a is denoted the distance between the coil portion pieces 40, 41.

I claim:

1. Arrangement for generating a plasma by means of cathode sputtering with
   a) a plasma chamber,
   b) a target in the plasma chamber which is connected with an electrode, which is connected to a power supply,
   c) a magnetron whose magnetic field exits from the target and enters into it again,
   d) at least one shielding metal sheet which extends perpendicularly to the surface of the target and is provided on at least one side of the target,
   characterized by
   e) a first coil wound about the shielding metal sheet and connected to a dc voltage source, and
   f) a second coil disposed at a distance from the first coil and connected to a high-frequency source.

2. Arrangement as stated in claim 1, characterized in that the distance between the first and the second coil is formed by the shielding metal sheet and an insulator.

3. Arrangement as stated in claim 1, which includes a plurality of shielding metal sheets and characterized in that two of the shielding metal sheets have the form of an L and the shielding metal sheets include remaining shielding metal sheets, wherein a lower shank of the L projects inwardly into the plasma volume and is electrically insulated from remaining shielding metal sheets and is connected to an electrical potential.

4. Arrangement as stated in claim 1, characterized in that the first coil is implemented as a hollow tube and a cooling means flows through it.

5. Arrangement as stated in claim 2, characterized in that the insulator comprises on its side directed toward the volume between the target and the substrate, grooves in which the windings of the second coil are embedded.

6. Arrangement as stated in claim 1, characterized in that the second coil is disposed toward the volume between target and substrate is shielded by an electrical insulator.

7. Arrangement as stated in claim 1, characterized in that the second coil is disposed toward the volume between target and substrate and is shielded by a non-magnetic metal plate which is suspended so as to be insulated and is connected to an electrical potential.

8. Arrangement as stated in claim 1, characterized in that the second coil is connected with its one end to the high-frequency source and with its other end to chassis or ground.

9. Arrangement as stated in claim 1, characterized in that the second coil with its two ends is connected to chassis or ground while a center region of said second coil is connected to a high-frequency generator.

10. Arrangement as stated in claim 1, characterized in that the second coil is divided into two halves of which one half has a winding direction in the clockwise direction and an other half has a winding direction in the counter clockwise direction.

11. Arrangement as stated in claim 1, characterized in that a dc field generated by the first coil has a strength of approximately 500 gauss.

12. Arrangement as stated in claim 1, characterized in that the high-frequency source is operated at a frequency of 13.56 MHz.

* * * * *

UNITED STATES PATENT AND TRADEMARK OFFICE
CERTIFICATE OF CORRECTION

PATENT NO : 5,417,834
DATED : May 23, 1995
INVENTOR(S): Rudolf Latz

It is certified that error appears in the above-identified patent and that said Letters Patent is hereby corrected as shown below:

In column 3, line 22 of the Patent, change "core" to-- one --.

Signed and Sealed this

Twenty-sixth Day of May, 1998

Attest:

BRUCE LEHMAN

Attesting Officer

Commissioner of Patents and Trademarks